US012793759B2

(12) United States Patent
Kang et al.

(10) Patent No.: US 12,793,759 B2
(45) Date of Patent: Nov. 10, 2026

(54) RESISTIVE MEMORY DEVICE AND WRITING METHOD THEREOF

(71) Applicant: SAMSUNG ELECTRONICS CO., LTD., Suwon-si (KR)

(72) Inventors: Gyuseong Kang, Suwon-si (KR); Hyun-Jin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 18/804,414

(22) Filed: Aug. 14, 2024

(65) Prior Publication Data

US 2025/0299717 A1 Sep. 25, 2025

(30) Foreign Application Priority Data

Mar. 22, 2024 (KR) ........................ 10-2024-0039536

(51) Int. Cl.
*G11C 11/16* (2006.01)

(52) U.S. Cl.
CPC ...... *G11C 11/1675* (2013.01); *G11C 11/1657* (2013.01); *G11C 11/1673* (2013.01)

(58) Field of Classification Search
CPC ........................ G11C 11/1675; G11C 11/1657
See application file for complete search history.

(56) References Cited

U.S. PATENT DOCUMENTS

| | | | | |
|---|---|---|---|---|
| 8,929,127 | B2 | 1/2015 | Antonyan | |
| 9,472,275 | B2 | 10/2016 | Park et al. | |
| 10,141,900 | B2 | 11/2018 | Saxena et al. | |
| 10,453,512 | B2 | 10/2019 | Katayama | |
| 11,062,774 | B2 | 7/2021 | Callaghan | |
| 11,908,503 | B2 | 2/2024 | Kang et al. | |
| 2021/0065791 | A1* | 3/2021 | Grobis | G11C 11/1673 |
| 2022/0084591 | A1* | 3/2022 | Kim | G11C 11/1657 |
| 2024/0161824 | A1* | 5/2024 | Lee | G11C 13/0004 |

* cited by examiner

*Primary Examiner* — Amir Zarabian
*Assistant Examiner* — Anthony Thinh Tang
(74) *Attorney, Agent, or Firm* — Sughrue Mion, PLLC

(57) ABSTRACT

A resistive memory device performs a selective write operation. Included in the resistive memory device are at least one memory cell, a reference resistance circuit whose resistance value is adjusted, a sense amplifier configured to read data stored in the at least one memory cell by comparing a resistance value of the at least one memory cell with a resistance value of the reference resistance circuit, a write driver configured to program write requested data into the at least one memory cell, and a selective write controller. The selective write controller performs a read-before-write operation by adjusting the resistance value of the reference resistor circuit according to the write data during the selective write operation.

20 Claims, 11 Drawing Sheets

RESISTIVE MEMORY DEVICE AND WRITING METHOD THEREOF

CROSS-REFERENCE TO RELATED APPLICATIONS

This application claims priority under 35 U.S.C. § 119 to Korean Patent Application No. 10-2024-0039536 filed on Mar. 22, 2024, in the Korean Intellectual Property Office, the disclosures of which are incorporated by reference herein in their entireties.

BACKGROUND

Embodiments of the present disclosure described herein relate to a storage device, and more specifically, to a semiconductor memory device, and more specifically, to a resistive memory device capable of improving selective writing performance and a writing method thereof.

Semiconductor memory devices can be broadly divided into volatile memory and non-volatile memory. Volatile memory (for example, DRAM or SRAM) has fast reading and writing speeds, but stored data is lost when the power supply is cut off. On the other hand, non-volatile memory (for example, magnetoresistive random-access memory (MRAM) or Flash memory) can preserve data even if the power supply is interrupted.

The memory cell of magnetic random access memory MRAM includes a magnetic tunnel junction MTJ element whose resistance changes depending on data and an access transistor. The write operation of MRAM is performed by activating the access transistor through the word line and applying a large current so that the data of the MTJ element can change. The value of data recorded in the MTJ element varies depending on the direction of the current.

Writing data to MRAM memory cells requires large currents and high word line voltage and write voltage. Therefore, a large amount of power is consumed in the write operation of MRAM. Selective write method can be used as a way to reduce the power required for the write operation of MRAM. The selective write method refers to a method of skipping data writing when the data stored in the memory cell and the write data are the same. In order to use the selective write method, a read-before-write operation must be performed to read data stored in the MRAM memory cell before the write operation. However, the low reliability of the read-before-write operation of MRAM due to various factors is becoming a problem.

SUMMARY

Embodiments of the present disclosure provides a resistive memory device and a writing method thereof that can improve the reliability of a selective write operation.

Provided herein is a resistive memory device performing a selective write operation, including: at least one memory cell; a reference resistance circuit whose reference resistance value is adjusted; a sense amplifier configured to read existing data stored in the at least one memory cell by comparing a resistance value of the at least one memory cell with the reference resistance value of the reference resistance circuit; a write driver configured to program write data into the at least one memory cell; and a selective write controller configured to perform a read-before-write operation by adjusting the reference resistance value of the reference resistance circuit according to the write data during the selective write operation.

Also provided herein is a method of a resistive memory device performing a selective write operation, including: receiving write data to be written into a selected memory cell; increasing or decreasing a reference resistance for a read-before-write operation to the selected memory cell according to a value of the write data to obtain a changed reference resistance; performing the read-before-write operation on the selected memory cell according to the changed reference resistance; and writing the write data to the selected memory cell according to a result of the read-before-write operation.

Also provided herein is a resistive memory device, including: a cell array including a plurality of MRAM cells; a row decoder configured to drive word lines of the plurality of MRAM cells in response to a row address; a read/write circuit connected to bit lines or source lines of the cell array and configured to perform a read-before-write operation on a selected memory cell based on a reference resistance value of a reference resistance circuit during a selective write operation; and a control circuit configured to adjust the reference resistance value of the reference resistance circuit according to write data during the selective write operation.

BRIEF DESCRIPTION OF DRAWINGS

The above and other objects and features of the present disclosure will become apparent by describing in detail embodiments thereof with reference to the accompanying drawings.

DETAILED DESCRIPTION

It is to be understood that both the foregoing general description and the following detailed description are exemplary. Reference signs are indicated in detail in embodiments, examples of which are indicated in the reference drawings. Wherever possible, the same reference numbers are used in the description and drawings to refer to the same or like parts.

Hereinafter, the advantages of embodiments will be explained using MRAM as an example. However, those skilled in the art will readily understand other advantages and capabilities of embodiments based on what is described herein. Embodiments may be implemented or applied in various ways. Moreover, the detailed description may be modified or changed according to viewpoints and applications without significantly departing from the scope, technical spirit and of embodiments provided herein.

Figure 1:
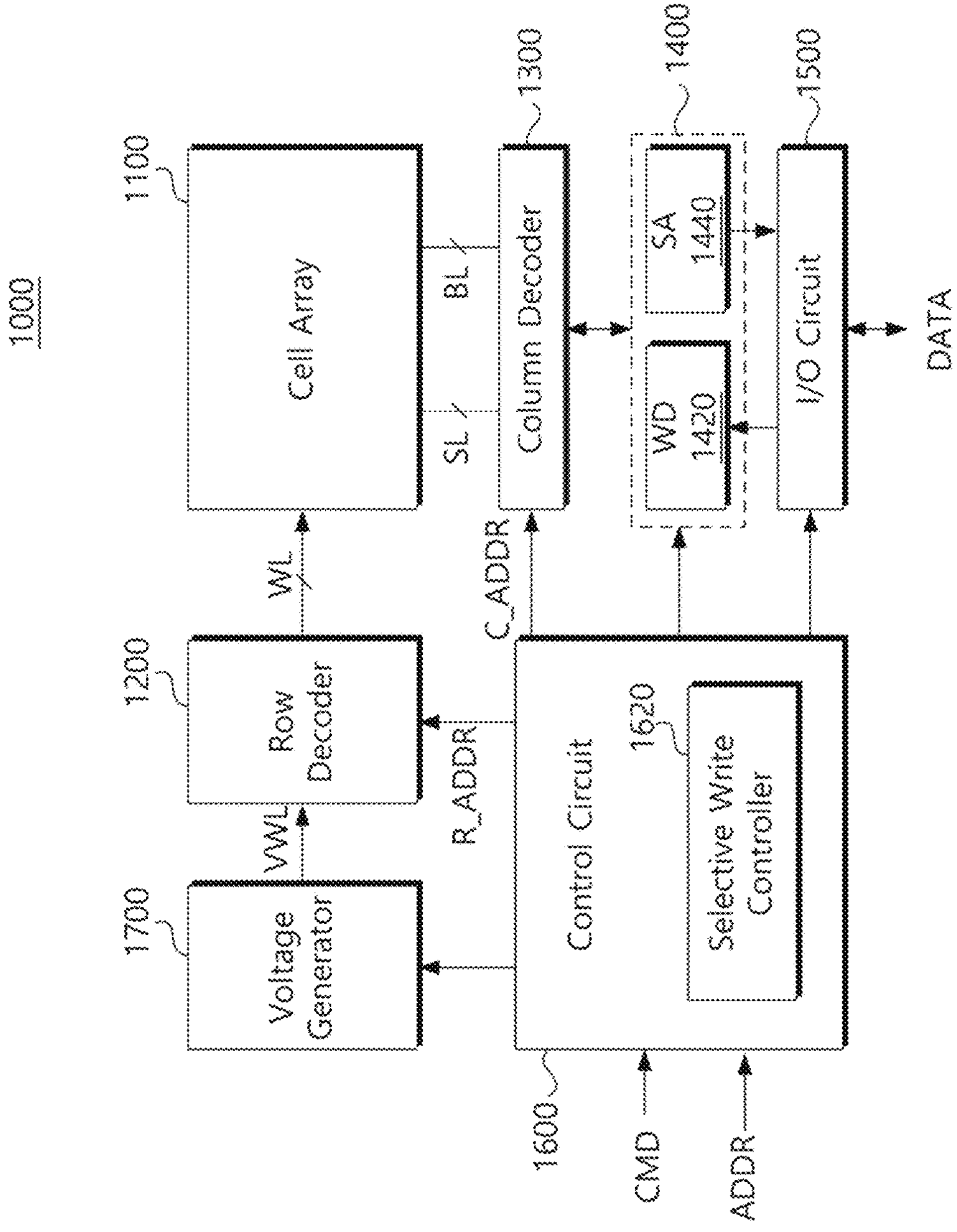
FIG. 1 is a block diagram showing a resistive memory device according to an example embodiment.

FIG. 1 is a block diagram showing a resistive memory device according to an embodiment. Referring to FIG. 1, a resistive memory device 1000 may include a cell array 1100, a row decoder 1200, a column decoder 1300, a read/write circuit 1400, an input/output circuit 1500, a control circuit 1600, and a voltage generator 1700.

The cell array 1100 may include a plurality of MRAM cells or bit cells that store data. Each of the plurality of bit cells included in the cell array 1100 may be disposed at a point where a plurality of word lines WL, a plurality of bit lines BL, and a source line SL intersect. For example, each bit cell may be connected to a corresponding word line among the plurality of word lines WL. Each of the bit cells may be connected to a corresponding bit line and source line among the plurality of bit lines BL and source lines SL. Bit cells can be selected by the word line voltage VWL provided to the selected word line. Each bit cell may include an access transistor and a magnetic tunnel junction MTJ element. And data can be stored in the selected bit cell through the bit line or source line, or sensing of the stored data can be performed.

Here, each of the bit cells is a magnetic random access memory MRAM element, such as STT-MRAM (Spin-Transfer Torque Magnetic Random Access Memory), Spin-RAM (Spin Torque Transfer Magnetization Switching RAM), and SMT-RAM (Spin Momentum Transfer). Alternatively, each of the bit cells may include a device configuration such as, but not limited to, phase change random access memory PRAM and ferroelectric random access memory FRAM.

The row decoder 1200 decodes the row address R_ADDR and selects one of the plurality of word lines according to the decoding result. During a write operation or a read operation, the row decoder 1200 may transfer the word line voltage VWL to any one word line selected by the row address R_ADDR. The access transistor of the memory cell selected by the row decoder 1200 will be turned on.

The column decoder 1300 may be connected to the cell array 1100 through the source line SL and/or the bit line BL. The column decoder 1300 may select the source line SL or the bit line BL in response to the column address C_ADDR provided from the control circuit 1600. The column decoder 1300 may select the source line SL or the bit line BL using a plurality of switches or a plurality of NMOS transistors (not shown) switched in response to the column address C_ADDR.

The read/write circuit 1400 is connected to the column decoder 1300 through data lines, and exchanges data with the outside through the input/output circuit 1500. During a program operation, the read/write circuit 1400 can receive write data from the input/output circuit 1500 and write it to the selected memory cell. The read/write circuit 1400 may sense a selected memory cell of the cell array 1100 and output the sensed data to the input/output circuit 1500 during a read operation. The read/write circuit 1400 can perform a selective write operation under the control of the control circuit 1600.

The read/write circuit 1400 may include a write driver 1420 and a sense amplifier 1440. The write driver 1420 writes write data provided from the input/output circuit 1500 to the selected memory cell under the control of the control circuit 1600. The write driver 1420 may receive a control signal from the control circuit 1600 and provide a program current or program voltage to a data line. The sense amplifier 1440 can read data stored in the selected memory cell by detecting the difference between the voltage of the source line SL and the reference voltage during the read operation. Here, the reference voltage can be generated using a reference resistor Rref. The reference resistor may be connected to a reference cell of the cell array 1100.

In particular, a reference resistor Rref of different resistance values is applied to the sense amplifier 1440 in a normal read operation and a read-before-write operation performed during the selective write operation. In the normal read operation, the sense amplifier 1440 senses selected memory cells using the reference resistor Rref of a preset default resistance. On the other hand, in the read-before-write operation, the sense amplifier 1440 senses data using the reference resistor Rref set to a value obtained by adding or subtracting a certain margin from the basic resistance value according to the logic value of the write data.

For example, when the selected memory cell needs to be programmed with first data D0, the read-before-write operation is performed for the selective write operation. At this time, the reference resistor Rref used by the sense amplifier 1440 may be set to a magnitude subtracted from the default resistance by a specific margin. On the other hand, when the selected memory cell must be programmed with the second data D1, the magnitude of the reference resistor Rref used in the read-before-write operation can be set to a value increased by a certain margin from the default resistance value. By adjusting the margin of this reference resistor, the reliability of the read-before-write operation can be improved.

The input/output circuit 1500 can exchange data DATA with an external device (e.g., a memory controller). For example, during the write operation, the input/output circuit 1500 may transfer data DATA received from the external device to the write driver 1420 of the read/write circuit 1400. During the read operation, the input/output circuit 1500 may output read data transmitted from the sense amplifier 1440 of the read/write circuit 1400 to the external device.

The control circuit 1600 receives control signals including a command CMD, an address ADDR, and a clock signal from the external device (e.g., a host or CPU) of the memory device 1000. The control circuit 1600 may control the operation of the memory device 1000 based on commands or addresses received from the external device. The control circuit 1600 may extract the row address R_ADDR from the received address ADDR and transmit it to the row decoder 1200, and transmit the column address C_ADDR to the column decoder 1300.

In particular, the control circuit 1600 includes a selective write controller 1620. The selective write controller 1620 controls the write driver 1420 and the sense amplifier 1440 to perform the selective write operation. When a write command is provided, the selective write controller 1620 performs a read-before-write operation to read data stored in the selected memory cell. In addition, the selective write controller 1620 determines whether to execute the data write operation to the selected memory cell by comparing the write data with sensing data as a result of the read-before-write operation.

During the read-before-write operation, the selective write controller 1620 may adjust the magnitude of the reference resistor Rref used by the sense amplifier 1440 according to the logic value of the write data. In other words, the selective write controller 1620 sets the reference resistor Rref of the sense amplifier 1440 to a value obtained by adding or subtracting a specific margin from the basic resistance value according to the logic value of the write data. When the selected memory cell needs to be programmed with the first data D0, the selective write controller 1620 adjusts the reference resistor Rref to a magnitude that reduces the read margin of the first data D0 for the read-before-write operation. For example, the selective write controller 1620 may set the reference resistor Rref to a magnitude subtracted by a specific margin. On the other hand, when the selected memory cell must be programmed with the second data D1, for the read-before-write operation, the selective write controller 1620 adjusts the reference resistor Rref to a magnitude that reduces the read margin of the second data D1. In other words, the selective write controller 1620 can set the reference resistor Rref used by the sense amplifier 1440 to a magnitude increased from the basic resistance value by a specific margin.

The voltage generator 1700 may generate a word line voltage VWL required to read or write data under the control of the control circuit 1600. The word line voltage VWL may be provided to the selected word line through the row decoder 1120.

In the above, the configuration of the resistive memory device 1000, in which the reference resistance value for sensing the selected memory cell is adjusted according to the bit value of the write data, was briefly described. In the read-before-write operation, the reliability of the read-before-write operation is improved by adjusting the resistance value of the reference resistor Rref according to the write data.

Figure 2:
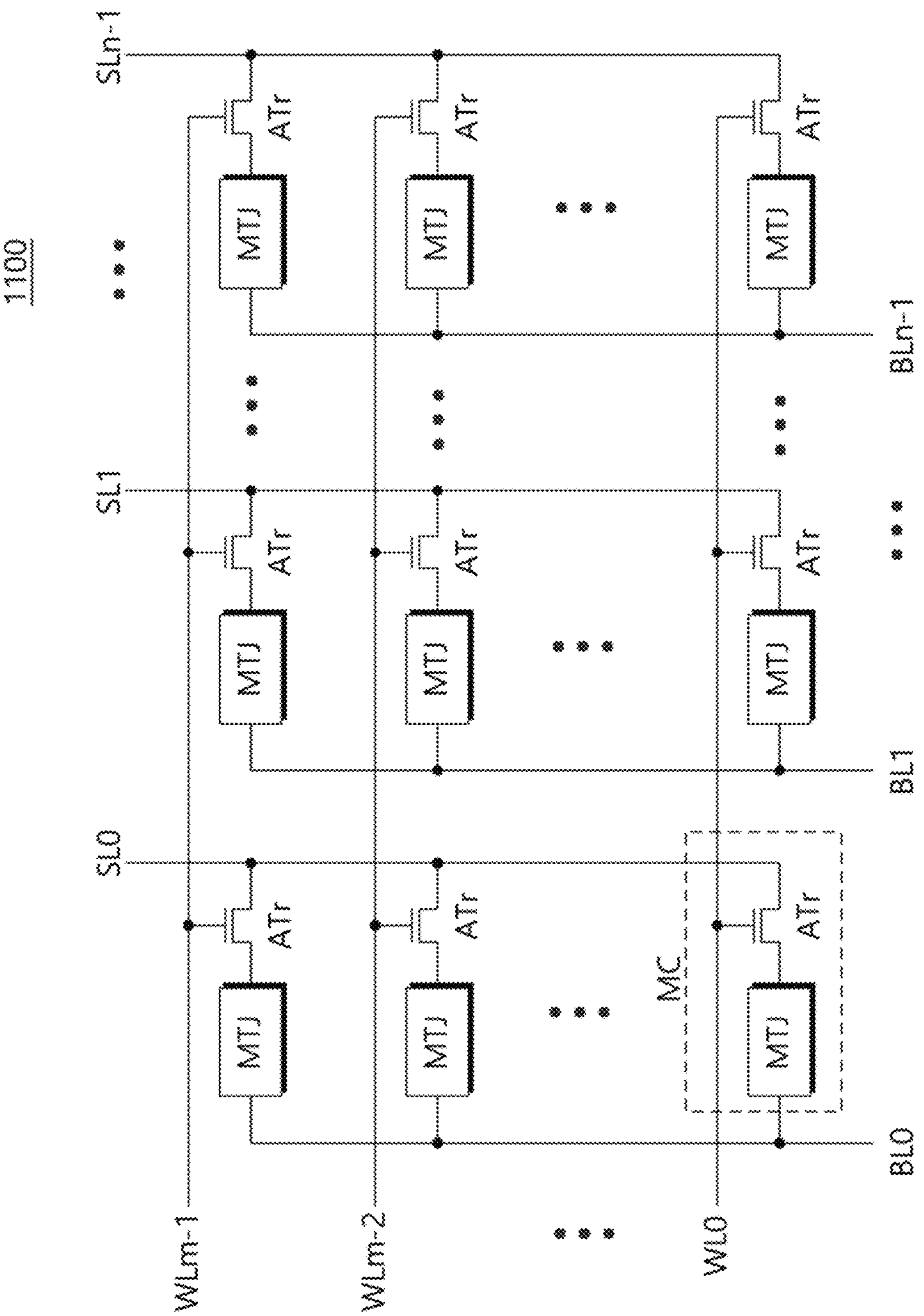
FIG. 2 is a diagram showing an exemplary configuration of the cell array of FIG. 1.

FIG. 2 is a diagram showing an exemplary configuration of the cell array of FIG. 1. Referring to FIG. 2, the cell array 1100 may include a plurality of memory cells MC arranged along row and column directions. Illustratively, in FIG. 2, one memory cell MC among a plurality of memory cells is indicated by a dotted box. Each memory cell MC may include a magnetic tunnel junction MTJ element and an access transistor ATr. As the MTJ elements constituting each memory cell MC are programmed to have a specific resistance value, data corresponding to the specific resistance value can be stored in each memory cell MC.

A plurality of memory cells may be connected to word lines WL0 to WLm−1, bit lines BL0 to BLn−1, and source lines SL0 to SLn−1. One end of each of the MTJ elements may be connected to the bit lines BL0 to BLn−1, and the other end of the MTJ element may be connected to one end of the access transistor ATr. The other end of the access transistor ATr may be connected to the source lines SL0 to SLn−1, and the gate electrode of the access transistor ATr may be connected to the word lines WL0 to WLm−1.

The word line voltage VWL of a memory cell selected by the row decoder 1200 among a plurality of memory cells is applied. Then, when the access transistor ATr is turned on by the word line voltage, the MTJ element is in a parallel state or an anti-balance state depending on the direction of the current applied through the bit line BL and source line SL. It is programmed in parallel state. Hereinafter, the parallel state in which the resistance value of the MTJ element is relatively small is referred to as first data (D0, or logic 0), and the anti-parallel state in which the resistance value is relatively large is referred to as second data (D1, or logic 1).

Figure 3:
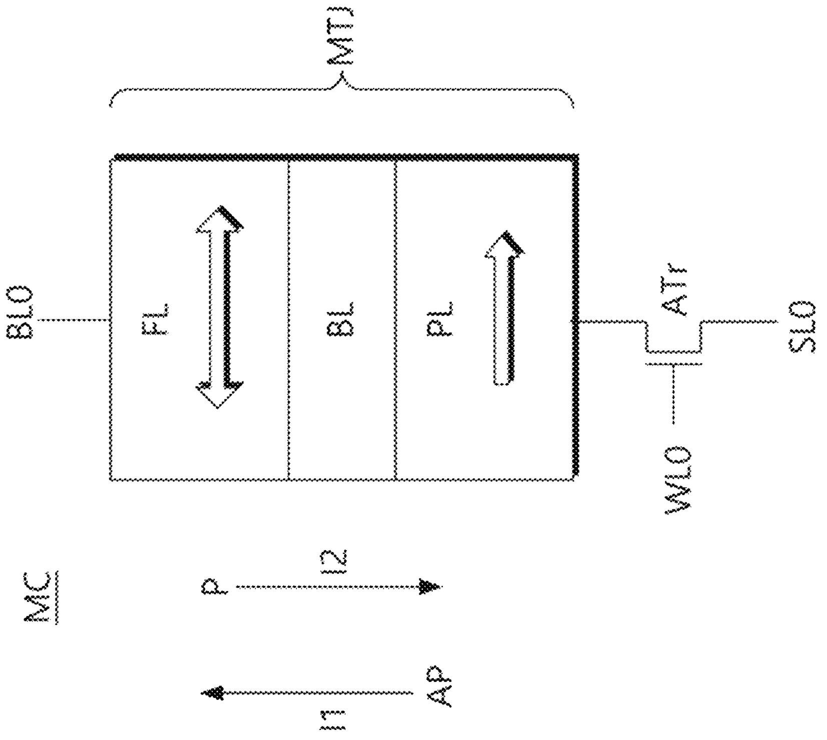
FIG. 3 is a diagram showing how data is written to the memory cell of FIG. 2.

FIG. 3 is a diagram showing how data is written into the memory cell of FIG. 2. Referring to FIG. 3, the memory cell MC may include an access transistor ATr and an MTJ element that are activated by the word line WL0.

The MTJ element may include a free layer FL, a barrier layer BL, and a pinned layer PL. The barrier layer BL is located between the free layer FL and the pinned layer PL. The free layer FL may be connected to the bit line BL0. The pinned layer PL may be connected to the other end of the access transistor ATr.

The magnetization direction of the pinned layer PL may be fixed to a specific direction, and the magnetization direction of the free layer FL may change depending on specific conditions (e.g., direction of writing current). Depending on the embodiment, the MTJ element may further include an anti-ferromagnetic layer to fix the magnetization direction of the pinned layer PL.

The free layer FL may include a material having a changeable magnetization direction. The magnetization direction of the free layer FL may be changed by electrical/magnetic factors provided outside and/or inside the memory cell MC. The free layer FL may include a ferromagnetic material including at least one of cobalt (Co), iron (Fe), and nickel (Ni). For example, the free layer FL may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$. However, the scope of the present disclosure is not limited thereto.

The thickness of the barrier layer BL may be thinner than the spin diffusion distance. The barrier layer BL may include a non-magnetic material. For example, the barrier layer BL may include at least one of magnesium (Mg), titanium (Ti), aluminum (Al), magnesium-zinc (MgZn), oxide of magnesium-boron (MgB), and titanium (Ti) and nitride of vanadium (V). However, the scope of the present disclosure is not limited thereto.

The pinned layer PL may have a magnetization direction fixed by the antiferromagnetic layer. The pinned layer PL may include a ferromagnetic material. For example, the pinned layer PL may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$. Depending on the embodiment, the antiferromagnetic layer may include an antiferromagnetic material. For example, the antiferromagnetic layer may include at least one of PtMn, IrMn, MnO, MnS, MnTe, $MnF_2$, $FeCl_2$, FeO, $CoCl_2$, CoO, $NiCl_2$, NiO, and Cr. However, the scope of embodiments is not limited thereto.

The magnetization direction of the free layer FL may change depending on the direction of the write currents I1 and I2 flowing through the MTJ element. For example, when a current flows from the source line SL0 to the bit line BL0, such as the first write current I1 shown in FIG. 4, the magnetization direction of the free layer FL is opposite to the magnetization direction of the pinned layer PL, and this state may be an anti-parallel state AP. On the contrary, when the current flows from the bit line BL0 to the source line SL0, such as the second write current I2, the magnetization direction of the free layer FL is the same as the magnetization direction of the pinned layer PL, and this state may be a parallel state P.

When the MTJ element is in the anti-parallel state AP, the MTJ element may have an anti-parallel resistance Rap. When the MTJ element is in the parallel state P, the MTJ element may have a parallel resistance Rp. In some embodiments, the memory device 1000 may store the first data D0 or the second data D1 using the size of the resistance value of the MTJ element. For example, when the MTJ element is in the parallel state P with a relatively small resistance value, logic '0' or first data D0 may be considered programmed. On the other hand, when the MTJ element is in the anti-parallel state AP with a relatively large resistance value, logic '1' or the second data D1 may be considered programmed.

The memory device 1000 may perform the read operation through comparison with a reference resistor Rref having an intermediate magnitude between the first data D0 and the second data D1. The reference resistor Rref can be adjusted according to write data rather than using a fixed value. The reference resistor Rref can be determined through a test operation. Data can be stored in the memory cell MC according to the resistance value setting of the MTJ element, and data stored in the memory cell MC can be sensed by reading the resistance value of the MTJ element.

Figure 4:
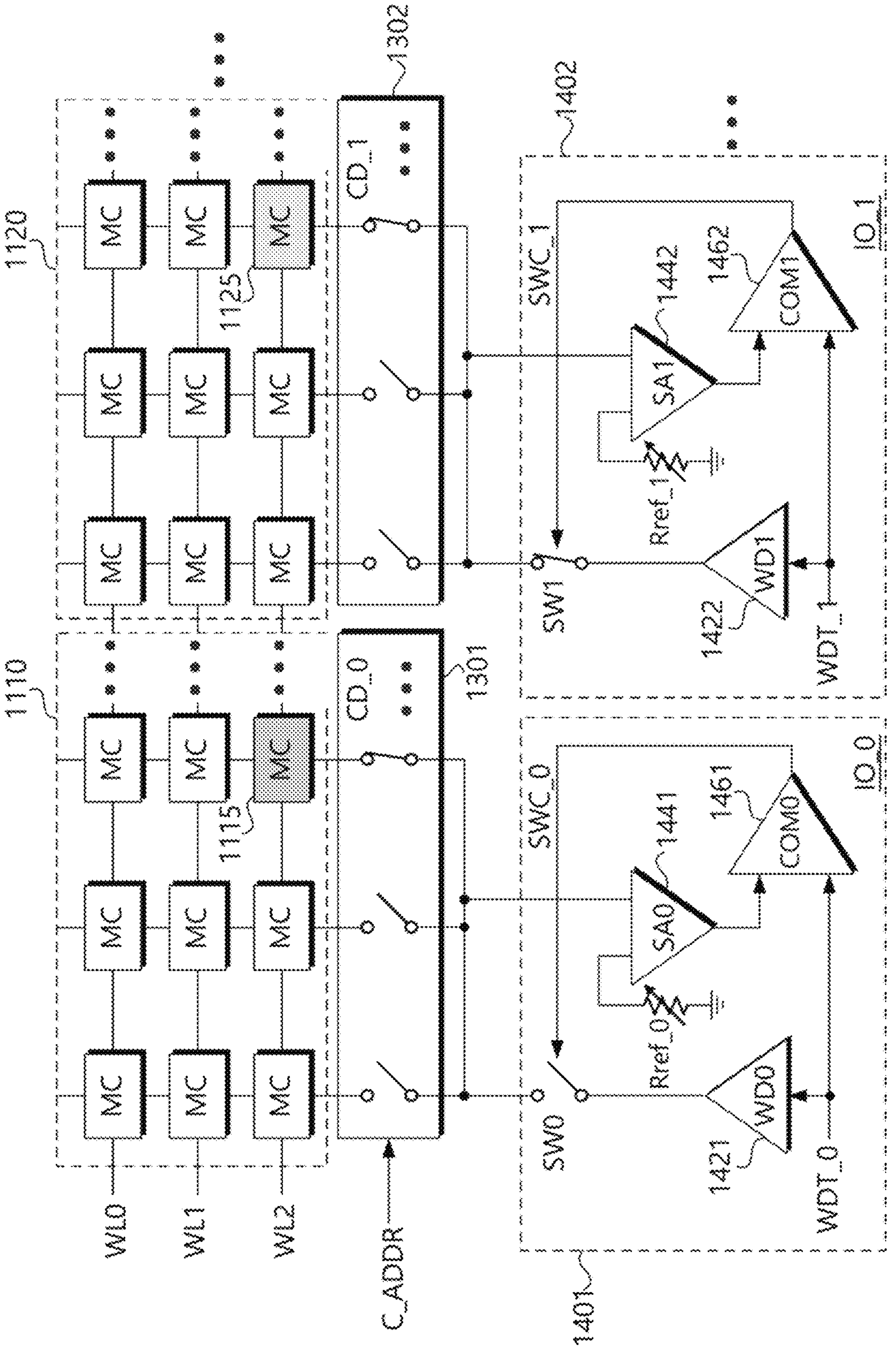
FIG. 4 is a diagram illustrating the structure of a read/write circuit that performs a selective write operation of an example embodiment.

FIG. 4 is a diagram illustrating the structure of a read/write circuit that performs a selective write operation of the present disclosure. Referring to FIG. 4, it is assumed that the memory cells selected for programming are memory cells 1115 and 1125 corresponding to input/output units IO_0 and IO_1, respectively. The memory cells 1115 and 1125 may be selected by activating the word line WL2 in the array units 1110 and 1120 of the input/output unit, respectively.

For the selective write operation on the memory cells 1115 and 1125, the column address C_ADDR will be provided as a value for selecting the column of the memory cells 1115 and 1125. Then, the column decoders 1301 and 1302 corresponding to each input/output unit IO_0 and IO_1 may connect the bit lines and source lines of the memory cells 1115 and 1125 into the first read/write circuit 1401 and the second read/write circuit 1402.

The first read/write circuit 1401 applies the selective write operation to program write data WDT_0 corresponding to the input/output unit IO_0 into the selected memory cell 1115. For the selective write operation, the first read/write circuit 1401 includes a first write driver 1421, a first switch SW0, a first sense amplifier 1441, a first reference resistor Rref_0, and a first comparator 1461. In order to program the write data WDT_0 to the selected memory cell 1115 according to the selective write operation, the first read/write circuit 1401 reads the data stored in the memory cell 1115. This operation will hereinafter be referred to as a read-before-write operation. At this time, the first sense amplifier 1441 will use the first reference resistor Rref_0 to sense the data stored in the memory cell 1115. And the first sense amplifier 1441 outputs the result of comparing the resistance value of the first reference resistor Rref_0 and the memory cell 1115 as read data. The first comparator 1461 controls the first switch SW0 by comparing the read result from the first sense amplifier 1441 and the write data WDT_0.

Here, it is assumed that the data stored in the memory cell 1115 and the write data WDT_0 are the same, and the data stored in the memory cell 1125 and the write data WDT_1 are different. Then, because the data read from the memory cell 1115 and the write data WDT_0 are the same, the first comparator 1461 blocks the first switch SW0. Accordingly, the program operation of the write data WDT_0 to the memory cell 1115 may be skipped.

The second read/write circuit 1402 applies the selective write operation to program write data WDT_1 corresponding to the input/output unit IO_1 into the selected memory cell 1125. For the selective write operation, the second read/write circuit 1402 includes a second write driver 1422, a second switch SW1, a second sense amplifier 1442, a second reference resistor Rref_1, and a second comparator 1462. In order to program write data WDT_1 to the selected memory cell 1125 according to the selective write operation, the second read/write circuit 1402 performs the read-before-write operation the data stored in the memory cell 1125, firstly. At this time, the second sense amplifier 1442 will use the second reference resistor Rref_1 to sense the data stored in the memory cell 1125. And the second sense amplifier 1442 outputs the result of comparing the resistance value of the second reference resistor Rref_1 and the memory cell 1125 as read data. The second comparator 1462 controls the second switch SW1 by comparing the read result from the second sense amplifier 1442 and the write data WDT_1.

The data stored in the memory cell 1125 read by the second sense amplifier 1442 has a different value from the write data WDT_1. For the selective write operation, write data WDT_1 must be physically written to the memory cell 1125. Accordingly, the second comparator 1462 turns on the second switch SW1. Then, the write current corresponding to the write data WDT_1 may be applied to the memory cell 1125 by the second write driver 1422. The memory cell 1125 will be programmed with write data WDT_1 by the write current.

According to the present disclosure, each of the reference resistors Rref_0 and Rref_1 used during the read-before-write operation performed for the selective write operation may be increased or decreased by a specific margin depending on the write data WDT_0 and WDT_1. For example, when the write data WDT_0 corresponds to the first data D0, the first reference resistor Rref_0 may be adjusted to a resistance value reduced by a margin of a specific value. That is, if the write data WDT_0 is the first data D0, the first reference resistor Rref_0 may be adjusted to a value that reduces the margin for the first data D0. In other words, if the write data WDT_0 is the first data D0, the first reference resistor Rref_0 may be adjusted to have the resistance value that increases the margin for the second data D1.

In addition, when the write data WDT_0 is the second data D1, the first reference resistor Rref_0 may be adjusted to have a resistance value that reduces the margin for the second data D1. In other words, if the write data WDT_0 is the second data D1, the first reference resistor Rref_0 may be adjusted to have a resistance value that increases the margin for the first data D0. During this read-before-write operation, the control method of the first reference resistor Rref_0 can be applied equally to all reference resistors including the second reference resistor Rref_1.

Here, the reference resistors Rref_0 and Rref_1 are indicated by variable resistance symbols, but embodiments are not limited to the disclosure here. The reference resistors Rref_0 and Rref_1 may be configured as a resistor-switch combination whose resistance value is varied by the selective write controller 1620 described above. In addition, each of the reference resistors Rref_0 and Rref_1 may be connected to source lines or bit lines of reference cells.

As described above, the magnitude of the reference resistors Rref_0 and Rref_1 used to identify data for the sense amplifiers 1441 and 1442 during the read-before-write operation performed for the selective write operation as adjusted depends on the write data WDT_0 and WD_1. Therefore, the reliability of the read-before-write operation can be increased.

Figure 5:
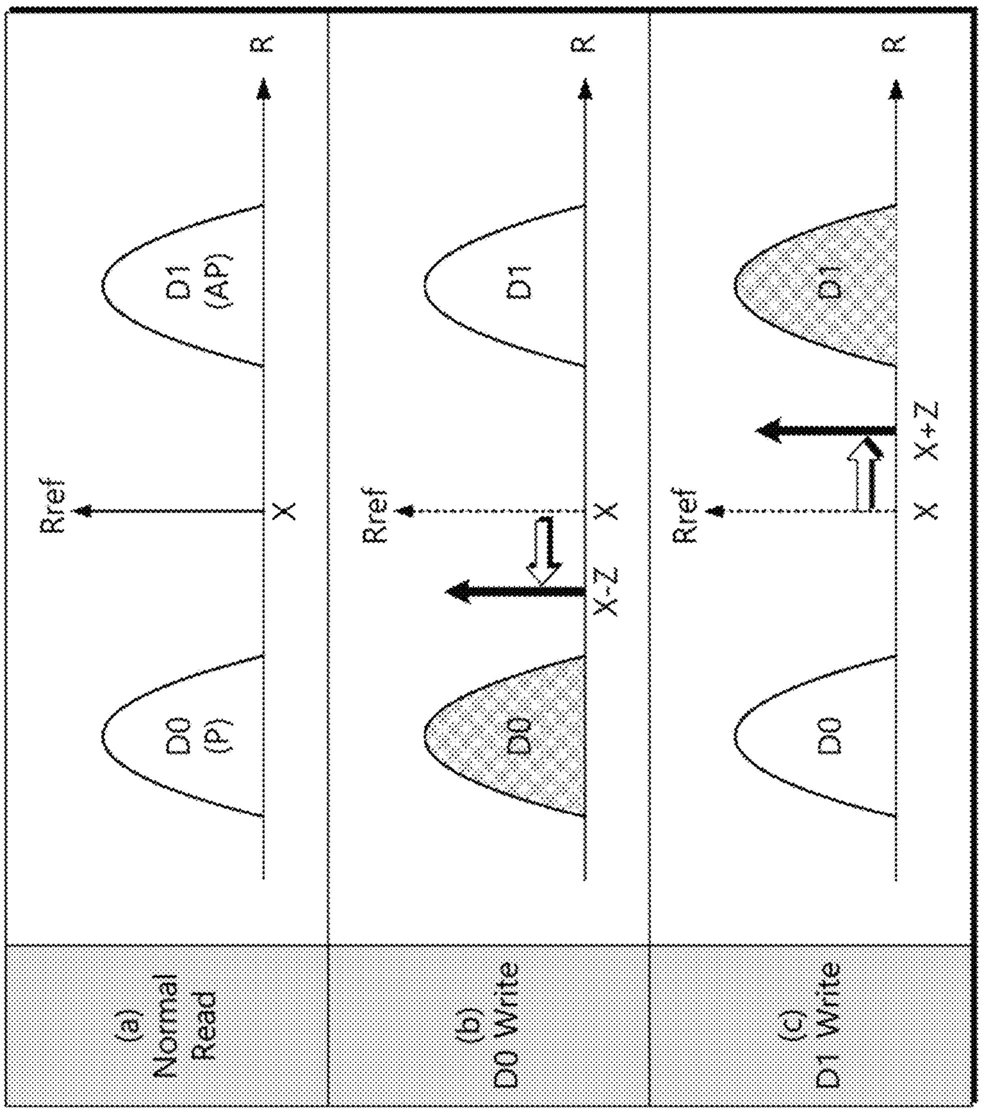
FIG. 5 is a diagram showing a reference resistance that varies depending on write data during a read-before-write operation of an example embodiment.

FIG. 5 is a diagram showing a reference resistance that varies according to write data during a read-before-write operation of the present disclosure. Referring to FIG. 5, the MTJ element of the memory cell MC has resistance values corresponding to the parallel state P and the anti-parallel state AP depending on the magnetization state of the free layer FL. The parallel state P represents a resistance distribution of the MTJ element when the magnetization directions of the pinned layer PL and the free layer FL are the same. And in the anti-parallel state AP, the MTJ element exhibits a resistance distribution when the magnetization directions of the pinned layer PL and the free layer FL are opposite. The resistance value in the parallel state P is relatively smaller than the resistance value in the anti-parallel state AP. In the present disclosure, the parallel state P is defined as being mapped to the first data D0, and the anti-parallel state AP is defined as being mapped to the second data D1. In FIG. 5, the y-axis direction represents a number of cells with a given resistance value indicated at that point on the x-axis. FIG. 5 corresponds to a histogram. Cells programmed with logical value D1 have a resistance R greater than X. Cells programmed with logical value D0 have a resistance R less than X.

As shown in item (a) of FIG. 5, during a normal read operation, the resistive memory device 1000 uses a reference resistance value (Rref=X) corresponding to the intermediate size of the first data D0 and the second data D1 to distinguish between the first data D0 and the second data D1. In other words, in response to a read command, the resistive memory device 1000 may apply a predetermined reference resistance value (X) to the selected memory cells. The reference resistance value (X) can be determined using testing or accumulated data. The reference resistance value (X) provided as a default value during a read operation will be referred to as the basic resistance value or default resistance value.

Items (b) and (c) of FIG. 5 provide examples of reference resistance values (Rref=X−Z, X+Z) of the resistive memory device 1000 applied during the read-before-write operation according to an embodiment. Item (b) shows the reference resistance value (Rref=X−Z) applied during the read-before-write operation when the write data corresponds to the first data D0. If the data requested to be written is first data D0 corresponding to a relatively small resistance state, the selective write controller 1620 (see FIG. 1) sets the reference resistance Rref to a resistance value (X−Z) reduced by a specific margin (Z) for the first data (D0).

When using a reference resistance Rref with a resistance value (X−Z) reduced by a specific margin (Z) during the read-before-write operation and if the data stored in the memory cell MC is the first data (D0), the read margin decreases. On the other hand, if the reference resistor Rref with the resistance value (X−Z) reduced by the specific margin (Z) is used, the read margin increases when the data stored in the memory cell MC is the second data D1. Accordingly, the detection reliability of the memory cell to which the first data D0 is to be written can be increased according to the selective write operation, which means improved reliability of the write operation. Here, the magnitude of the specific margin (Z) may be determined by considering various variables such as the error bit rate of the resistive memory device 1000, process changes, and temperature.

The read-before-write algorithm first checks data existing in a memory cell, before determining whether to perform a write. This original data may be referred to herein as "existing data," as this is data existing in the memory cell before the read-before-write operation.

Embodiments address a problem of skipping a write operation to save current if a present resistance of cell to be read is the same as the logic value to be written, but is near the threshold value used for comparison (see items (b) and (c) of FIG. 5). The present resistance of the cell corresponds to a logic value of existing data. To avoid skipping the write operation when the present resistance is near the threshold, embodiments move the threshold toward the typical value of the resistance for the logic value to be written. In FIG. 5, item (b), when the data to be written is D0, the threshold is moved closer to a position where the peak value of cells read with value D0 occurs (in FIG. 5 item (b), to the left). This increases a likelihood of detecting the resistance of the logic cell as corresponding to D1. In some instances, then, the write will not be skipped and the cell will be programmed with a resistance value of D0 near the typical value for the logic value to be written. When a reading of this memory cell later takes place, the resistance value will not be near the threshold value used for comparison, X, but will instead be nearer to the peak value of the cells read with value D0. A likelihood of reading the wrong value (D1 in the example of FIG. 5 item (b), after an earlier write of D0) is decreased. A similar description with D0 and D1 reversed is applicable for FIG. 5 item (c). FIG. 5 item (c) shows the reference resistance value (Rref=X+Z) applied during the read-before-write operation when the write data corresponds to the second data D1. If the data requested to be written is second data D1 corresponding to a relatively high resistance state, the selective write controller 1620 sets the reference resistance Rref to a resistance value (X+Z) increased by a specific margin (Z) for the second data D1.

When using the reference resistor Rref with the resistance value (X+Z) increased by the specific margin (Z) during a read-before-write operation and if the data stored in the memory cell MC is the first data D0, the read margin may increase. On the other hand, if a reference resistor Rref with a resistance value (X+Z) increased by the specific margin (Z) is used, the read margin decreases when the data stored in the memory cell MC is the second data D1. Accordingly, detection reliability for the memory cell to which the second data D1 is to be written can be increased according to the selective write operation.

Figure 6:
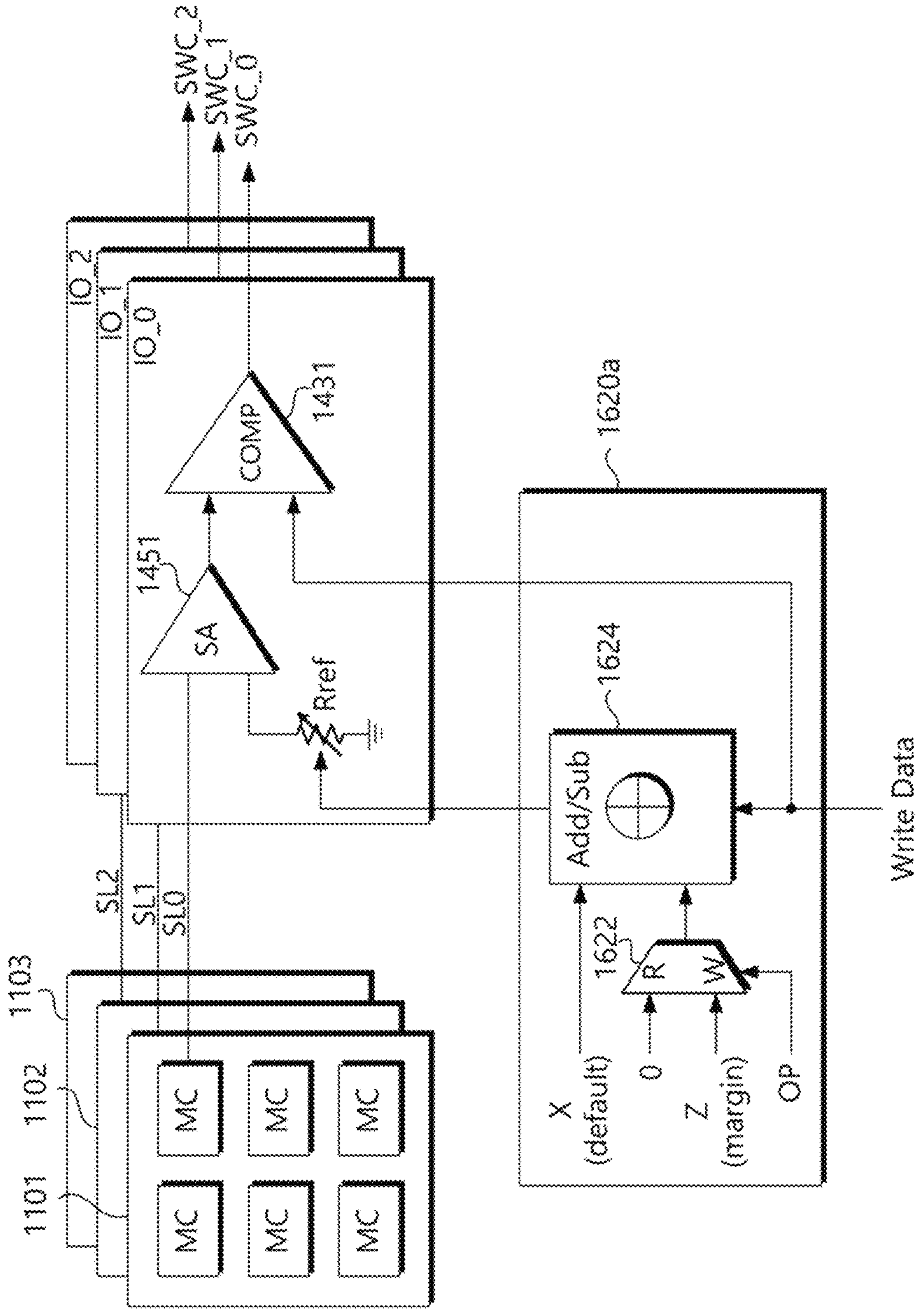
FIG. 6 is a block diagram showing the configuration of a selective write controller according to an example embodiment.

FIG. 6 is a block diagram showing the configuration of a selective write controller according to an embodiment. Referring to FIG. 6, the selective write controller 1620*a* may perform a selective write operation on memory cells by separating the write phase for each write data D0 and D1. For example, the selective write controller 1620*a* may program the first data D0 among the write data into selected memory cells and then program the second data D1.

In order to write data according to a separate write phase, the selective write controller 1620*a* can set a reference resistor Rref according to the operation mode OP and type of write data. The selective write controller 1620*a* may include a multiplexer 1622 and an adder/subtractor 1624 for setting a reference resistor Rref according to the operation mode OP and type of write data. The adder/subtractor 1624 may be implemented by a mixture of digital logic gates and analog components such as resistors, transistors and operational amplifiers. Hereinafter, the writing step performed by the selective write controller 1620 will be explained through an example in which the writing step is performed separately into a writing step of the first data D0 and a subsequent writing step of the second data D1.

The multiplexer 1622 selects write mode W or read mode R according to the operation mode OP. In the read mode R, a zero margin (0) to be added or subtracted from the reference resistor Rref is selected and transmitted to the adder/subtractor 1624. The multiplexer 1622 may be implemented by a mixture of digital logic gates and analog components such as resistors, transistors and operational amplifiers. On the other hand, in the write mode W, the multiplexer 1622 selects a specific margin (Z) to be added or subtracted from the reference resistor Rref and transmits it to the adder/subtractor 1624. The selective write operation is included as part of the write operation. Accordingly, in the writing phase of the first data D0 and the subsequent writing phase of the second data D1, the multiplexer 1622 will select the writing mode W. As a result, in the read-before-write operation performed in the selective write operation, the multiplexer 1622 selects a specific margin (Z) and transfers it to the adder/subtractor 1624.

The adder/subtractor 1624 is provided with a reference resistance value (Rref=X) of a basic or default value to be applied during the normal read operation. And the adder/subtractor 1624 receives the specific margin (Z) provided from the multiplexer 1622. The adder/subtractor 1624 may add or subtract the specific margin (Z) from the basic resistance value (X) according to write data. For example, in the normal read operation mode, the adder/subtractor 1624 adds or subtracts the zero margin (0) to the default resistance value (Rref=X) and provides it as a set value of the reference resistor Rref. On the other hand, in the write operation mode, the adder/subtractor 1624 adds or subtracts the specific margin (Z) from the default resistance value (Rref=X) and provides it as a set value of the reference resistor Rref. In particular, in the write operation of the first data D0, the adder/subtractor 1624 may set the reference resistor Rref to a resistance value (X−Z) obtained by subtracting the specific margin (Z) from the default resistance value (X). On the other hand, in the write operation of the second data D1, the adder/subtractor 1624 may set the reference resistor Rref to a resistance value (X+Z) obtained by adding the specific margin (Z) to the default resistance value (X).

When the first data D0 write phase begins, the multiplexer 1622 selects the specific margin (Z) and transmits it to the adder/subtractor 1624. Since the write data is the first data D0, the adder/subtractor 1624 sets the reference resistor Rref to the resistance value (Rref=X−Z) obtained by subtracting a specific margin (Z) from the default resistance value (Rref=X). Then, under the condition of the reference resistance value (Rref=X−Z) with the reduced margin, the sense amplifier 1451 performs the read-before-write operation on the selected memory cell. Data sensed by the sense amplifier 1451 is compared with write data (i.e., D0) by the comparator 1431. And, according to the comparison result of the comparator 1431, switch control signals SWC_0, SWC_1, and SWC_2 for connecting or disconnecting the write driver 1420 to the memory cell are generated. The comparator 1431 generates switch control signals SWC_0, SWC_1, and SWC_2 to turn off the switches SW0, SW1, and SW2 if the sensed data and the write data are the same. The comparator 1431 generates switch control signals SWC_0, SWC_1, and SWC_2 to turn on the switches (SW0, SW1, and SW2) when the sensed data and write data are different. Accordingly, the switches SW0, SW1, and SW2 connect or disconnect the write driver 1420 to the selected memory cell according to the switch control signals SWC_0, SWC_1, and SWC_2.

When the second data D1 write phase begins, the multiplexer 1622 selects the specific margin (Z) and transfers it to the adder/subtractor 1624. Since the write data is the second data D1, the adder/subtractor 1624 sets the reference resistor Rref as the resistance value (X+Z) obtained by adding a specific margin (Z) to the default resistance value (X). Then, under the condition of the margin-added resistance value (Rref=X+Z), the sense amplifier 1451 performs the read-before-write operation the selected memory cell. Data sensed by the sense amplifier 1451 is compared with write data (i.e., D1) by the comparator 1431. And, according to the comparison result of the comparator 1431, switch control signals SWC_0, SWC_1, and SWC_2 for connecting or disconnecting the write driver 1420 to the memory cell are generated. The switches SW0, SW1, and SW2 connect or disconnect the write driver 1420 to the memory cell according to the switch control signals SWC_0, SWC_1, and SWC_2.

Figure 7:
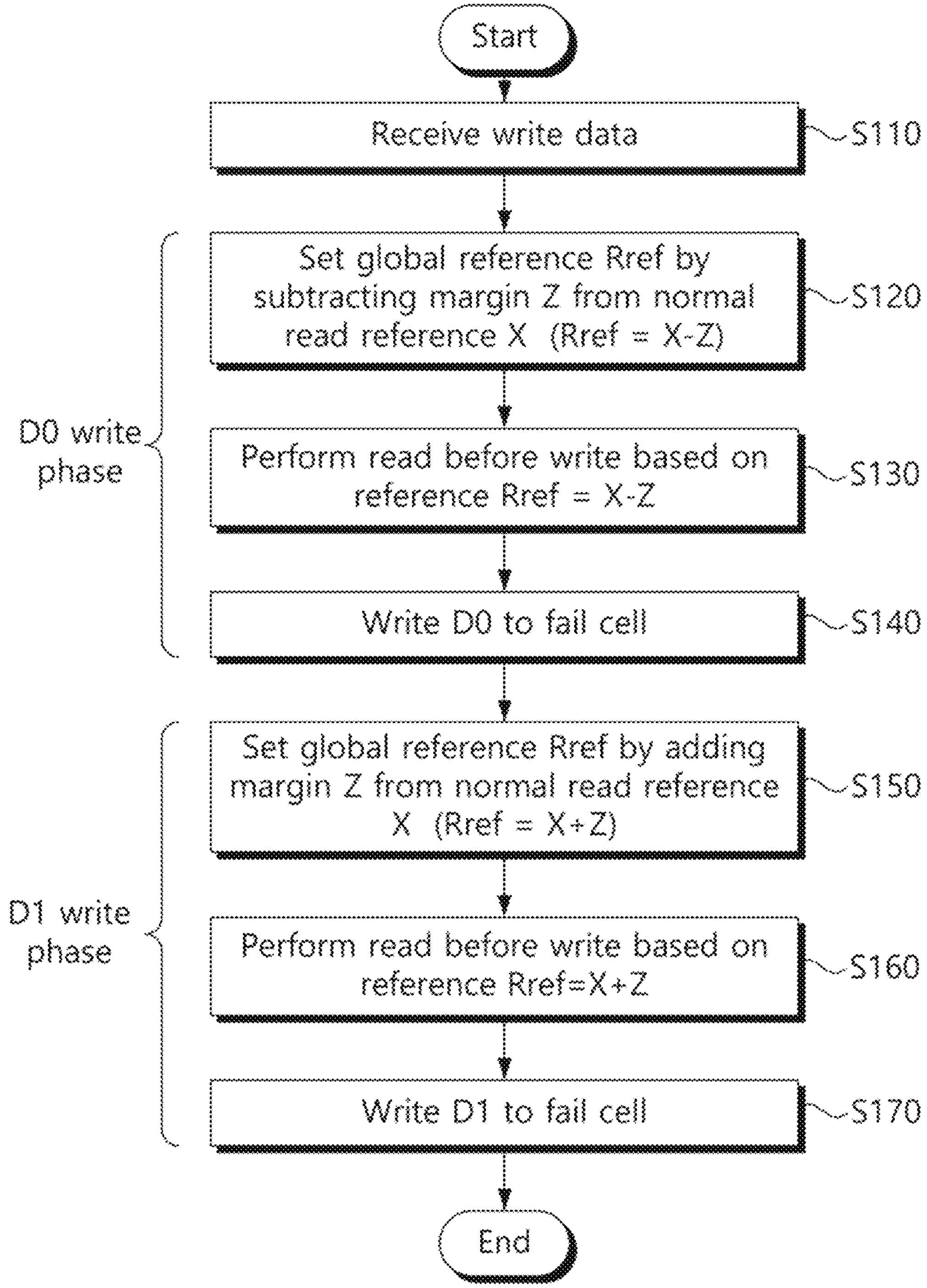
FIG. 7 is a flowchart showing a selective write operation of writing data according to the separate write phase of FIG. 6.

FIG. 7 is a flowchart showing a selective write operation of writing data according to the separate write phase of FIG. 6. Referring to FIG. 7, the selective write controller 1620*a* (see FIG. 6) may sequentially perform a program for selected memory cells using different reference resistance values depending on the write phase. The selective write controller 1620*a* may be implemented by a mixture of digital logic gates and analog components such as resistors, transistors and operational amplifiers.

In step S110, the resistive memory device 1000 receives write data requested to be written. Write data will be provided along with a write command and address from outside the resistive memory device 1000. Write data received through the input/output circuit 1500 will be divided into input/output units (IO units) and transmitted to the read/write circuit 1400.

A first data write phase (D0 write phase) is performed in steps S120 to S140, and a second data write phase (D1 write phase) is performed in subsequent steps S150 to S170.

In step S120, the selective write controller 1620*a* sets the reference resistor Rref for the read-before-write operation. That is, the multiplexer 1622 of the selective write controller 1620*a* selects a specific margin (Z) and transfers it to the adder/subtractor 1624. The adder/subtractor 1624 sets the reference resistor Rref to a resistance value (X−Z) obtained by subtracting a specific margin (Z) from the default resistance value (X).

In step S130, the sense amplifier 1451 performs the read-before-write operation on the selected memory cell under the condition of the reference resistance value (Rref=X−Z) in which a specific margin is subtracted from the default resistance value. Data sensed by the sense amplifier 1451 is compared with write data (i.e., D0) by the comparator 1431. And, according to the comparison result of the comparator 1431, switch control signals SWC_0, SWC_1, and SWC_2 for connecting or disconnecting the write driver 1420 to the memory cell are generated. The comparator 1431 generates switch control signals SWC_0, SWC_1, and SWC_2 to turn off the switches SW0, SW1, and SW2 if the sensed data and the write data are the same. The comparator 1431 generates switch control signals SWC_0, SWC_1, and SWC_2 to turn on the switches SW0, SW1, and SW2 when the sensed data and write data are different. Accordingly, the switches SW0, SW1, and SW2 connect or disconnect the write driver 1420 to the selected memory cell according to the switch control signals SWC_0, SWC_1, and SWC_2.

In step S140, the write driver 1420 programs the first data D0 for the selected memory cells. At this time, the program will be executed only in memory cells connected by the write driver 1420 and the switches SW0, SW1, and SW2. The program of the memory cells blocked from the write driver 1420 by the switches SW0, SW1, and SW2 may be skipped.

In step S150, the selective writing operation for the second data D1 begins. The selective write controller 1620*a* sets the reference resistor Rref for the read-before-write operation. That is, the multiplexer 1622 of the selective write controller 1620 selects a specific margin (Z) and transfers it to the adder/subtractor 1624. The adder/subtractor 1624 sets the reference resistor Rref to a resistance value (X+Z) obtained by adding a specific margin (Z) to the default resistance value (X).

In step S160, the sense amplifier 1451 performs the read-before-write operation on the selected memory cell under the condition of the reference resistance value (Rref=X+Z) with a margin added to the default resistance value. Data sensed by the sense amplifier 1451 is compared with write data (i.e., D1) by the comparator 1431. And, according to the comparison result of the comparator 1431, switch control signals SWC_0, SWC_1, and SWC_2 for connecting or disconnecting the write driver 1420 to the memory cell are generated. The comparator 1431 generates switch control signals SWC_0, SWC_1, and SWC_2 to turn off the switches SW0, SW1, and SW2 if the sensed data and the write data are the same. The comparator 1431 generates switch control signals SWC_0, SWC_1, and SWC_2 to turn on the switches SW0, SW1, and SW2 when the sensed data and write data are different. Accordingly, the switches SW0, SW1, and SW2 connect or disconnect the write driver 1420 to the selected memory cell according to the switch control signals SWC_0, SWC_1, and SWC_2.

In step S170, the write driver 1420 programs the second data D1 for the selected memory cells. At this time, the program will be executed only in memory cells connected by the write driver 1420 and the switches SW0, SW1, and SW2. The program of the of the memory cells blocked from the write driver 1420 by the switches SW0, SW1, and SW2 may be skipped.

In the above, the selective write operation of performing programming for memory cells by separating the write phase for each data (D0, D1) was briefly explained. Here, an example in which the first data D0 is written before the second data D1 has been described, but embodiments are not limited to this order. That is, even when the second data D1 is written to the memory cell before the first data D0, the reference resistance setting method in the read-before-write operation can be effectively applied.

Figure 8:
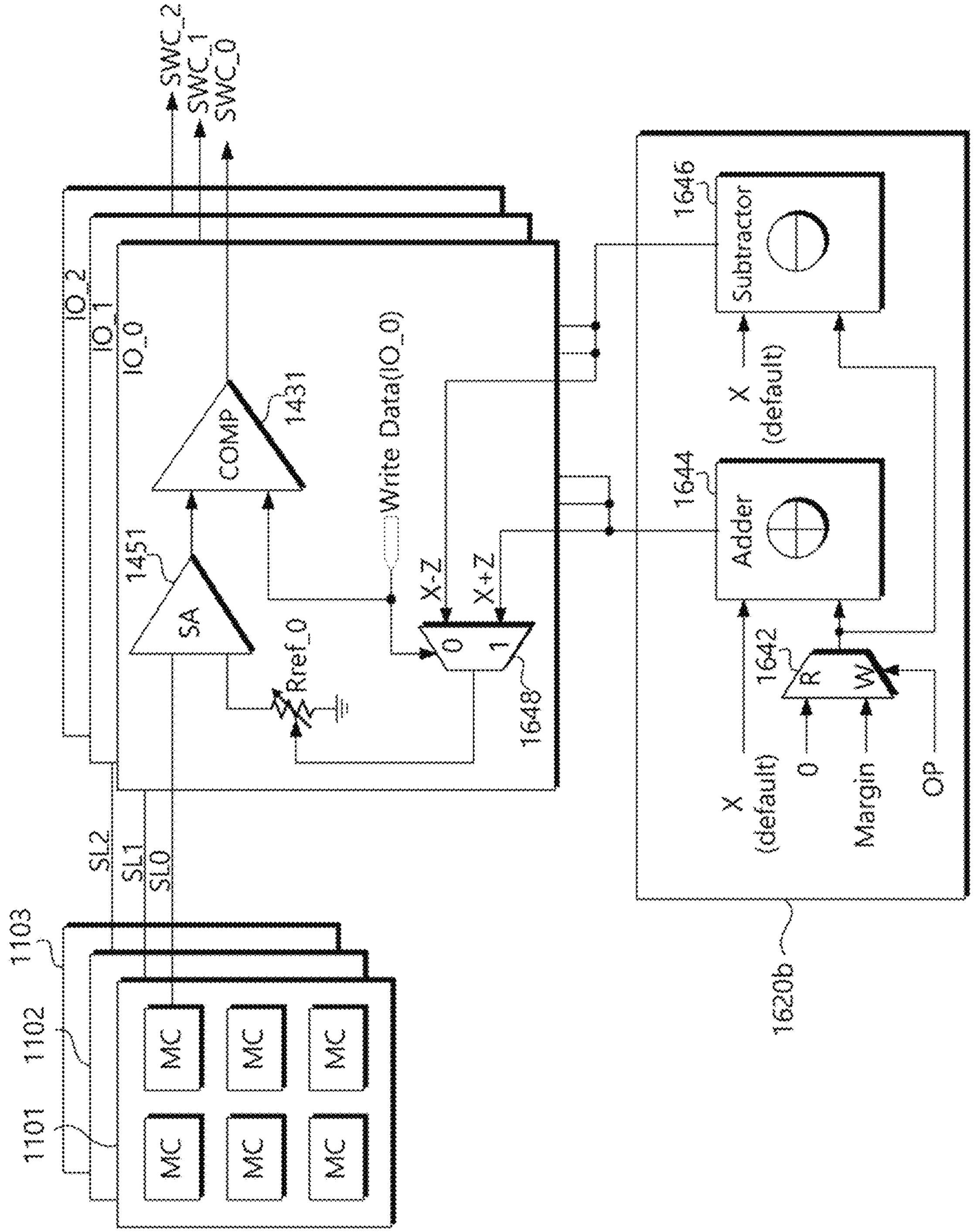
FIG. 8 is a block diagram showing a selective write controller according to another example embodiment.

FIG. 8 is a block diagram showing a selective write controller according to another embodiment. Referring to FIG. 8, a selective write controller 1620*b* can simultaneously program the selected memory cells without distinguishing between the writing phases of the first data D0 and the second data D1. The selective write controller 1620*b* may be implemented by a mixture of digital logic gates and analog components such as resistors, transistors and operational amplifiers. That is, the selective write controller 1620*b* can simultaneously set reference resistance values corresponding to write data and perform a read-before-write operation. Additionally, the selective write controller 1620*b* may simultaneously write the first data D0 and the second data D1 to the selected memory cells according to the result of the read-before-write operation.

The selective write controller 1620*b* may set the reference resistance (Rref_0) corresponding to the input/output unit (IO_0) depending on the operation mode OP and type of write data. The selective write controller 1620*b* may include a first multiplexer 1642, an adder 1644, and a subtractor 1646 for setting the reference resistance Rref_0 according to the operation mode OP and type of write data. The selective write controller 1620*b*, the first multiplexer 1642, the adder 1644, and the subtractor 1646 may be implemented by a mixture of digital logic gates and analog components such as resistors, transistors and operational amplifiers.

The first multiplexer 1642 selects write mode W or read mode R according to the operation mode OP. In the read mode R, the first multiplexer 1642 selects (0) as a margin to be added or subtracted from the reference resistor Rref and transmits it to the adder 1644 or subtractor 1646. On the other hand, in the write mode W, the first multiplexer 1642 selects a specific margin (Z) to be added to or subtracted from the reference resistor Rref and transmits it to the adder 1644 or subtractor 1646. The selective write operation is a type of write operation. Therefore, in a selective write operation, the first multiplexer 1642 will select the write mode W. In a read-before-write operation performed in the selective write operation, the multiplexer 1642 will select a specific margin (Z) and transfer it to the adder 1644 or subtractor 1646. On the other hand, in a normal read operation, the first multiplexer 1642 selects the read mode R. Accordingly, the first multiplexer 1642 will transmit margin (0) to the adder 1644 or subtractor 1646 in normal read mode.

The adder 1644 is provided with a default resistance value (X) to be applied during a normal read operation. In addition, the margin (0 or Z) provided from the first multiplexer 1642 is transmitted to the adder 1644. In read mode R, margin (0) is transmitted to the adder 1644. On the other hand, in read-before-write mode, a specific margin (Z) will be passed to the adder 1644. The adder 1644 adds the default resistance value (X) and the margin (0 or Z) according to the operation mode and provides the sum to the second multiplexer 1648.

Like the adder 1644, the subtractor 1646 is also provided with the default resistance value (X) to be applied during the normal read operation. Additionally, the margin (0 or Z) provided from the first multiplexer 1642 is transmitted to the subtractor 1646. In read mode R, margin (0) is transmitted to the subtractor 1646. On the other hand, in read-before-write mode, margin (Z) will be delivered to the subtractor 1646. The subtractor 1646 adds the default resistance value (X) and the margin (0 or Z) according to the operation mode and provides the sum to the second multiplexer 1648.

The selective write controller 1620*b* simultaneously calculates a sum of the default resistance value (X) and the margin (0 or Z) and difference between the margin (0 or Z) and the default resistance value (X). In other words, the adder 1644 adds the default resistance value (X) and the margin (0 or Z) to a resistance value (X+Z). At the same time, the subtractor 1646 calculates a resistance value (Rref=X−Z) by subtracting the specific margin (Z) from the default resistance value (X). And the calculated resistance values (X+Z, X−Z) are transmitted to the second multiplexer 1648 corresponding to each input/output unit (IO_1, IO_2 . . . ).

The second multiplexer 1648 of each of the input/output units (IO_1, IO_2, . . . ) sets the reference resistor Rref by applying the margin according to the write data. When the write data corresponds to the first data D0, the second multiplexer 1648 sets the reference resistor Rref_0 to a reference resistance value (X−Z) obtained by subtracting a specific margin (Z) from the default resistance value (X). On the other hand, when the write data corresponds to the second data D1, the second multiplexer 1648 sets the reference resistor Rref_0 to the resistance value (X+Z) obtained by adding the margin (Z) and the default resistance value (X).

Once the setting of the reference resistor Rref_0 is completed, the read-before-write operation is performed for each input/output unit (IO_1, IO_2, . . . ) for the selected memory cells. The sense amplifier 1451 senses data of the selected memory cell using the reference resistor Rref_0 set according to the write data. Data sensed by the sense amplifier 1451 is compared with write data Write Data(IO_0) by the comparator 1431. And, according to the comparison result of the comparator 1431, a switch control signal SWC_0 is generated to connect or disconnect the write driver 1420 from the memory cell. The read-before-write operation using this adjusted reference resistance is also performed simultaneously by each of the input/output units (IO_1, IO_2, . . . ). Accordingly, the switch control signals (SWC_1, SWC_2, . . . ) can also be generated simultaneously with the switch control signal SWC_0. The comparator 1431 will generate the switch control signal SWC_0 to turn off the switch SW0 if the sensed data and the write data are the same. On the other hand, the comparator 1431 will generate the switch control signal SWC_0 to turn on the switch SW0 if the sensed data and the write data are different.

Figure 9:
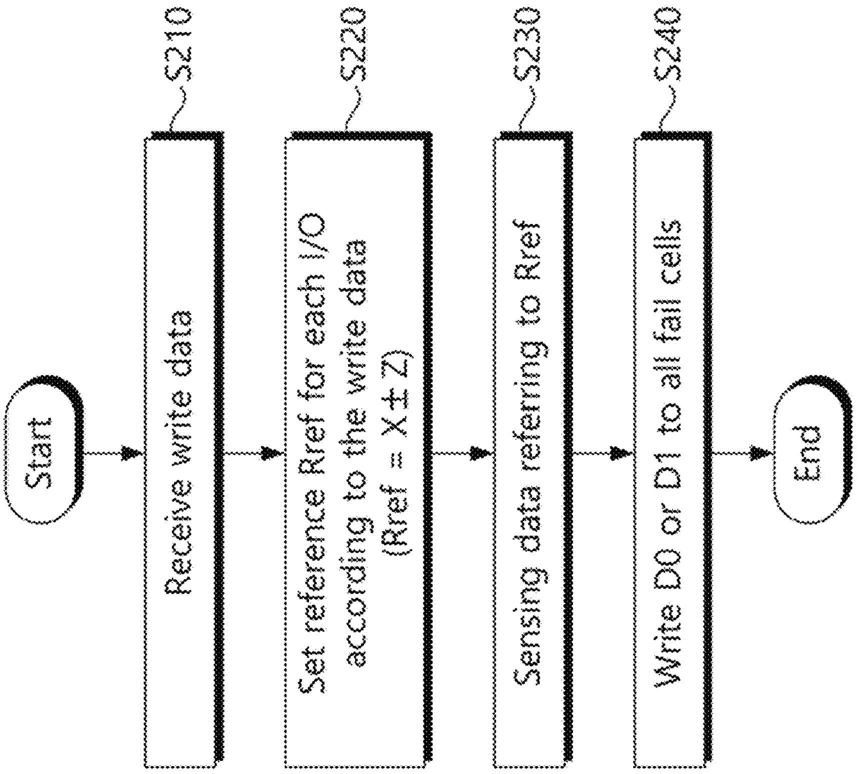
FIG. 9 is a flowchart showing a selective write operation performed by the selective write controller of FIG. 8.

FIG. 9 is a flowchart showing a selective write operation performed by a selective write controller of FIG. 8. Referring to FIG. 9, the selective write controller 1620*b* can simultaneously perform read-before-write operation regardless of the bit value of write data provided in input/output units.

In step S210, the resistive memory device 1000 receives write data requested to be written. Write data will be provided along with a write command and address from outside the resistive memory device 1000. Write data received through the input/output circuit 1500 will be divided into input/output units and transmitted to the read/write circuit 1400.

In step S220, the selective write controller 1620*b* sets the reference resistors (Rref 0, Rref_1, Rref_2, . . . ) for the read-before-write operation. In other words, the multiplexer 1622 of the selective write controller 1620 sets the reference resistor Rref to a resistance values (X−Z, X+Z) obtained by adding or subtracting a specific margin (Z) from the default resistance value (X) according to the write data. At this time, the selective write controller 1620*b* will simultaneously set the reference resistors (Rref 0, Rref_1, Rref_2, . . . ) to reference resistance values classified according to write data.

In step S230, when the setting of the reference resistors (Rref 0, Rref_1, Rref_2, . . . ) is completed, the read-before-write operation is performed for each input/output unit for the selected memory cells. Data stored in selected memory cells is sensed using reference resistors (Rref_0, Rref_1, Rref_2, . . . ) set according to the write data. And the data sensed in input/output units will be compared with the write data. As a result of comparing the data sensed by the read-before-write operation and the write data, switch control signals (SWC_0, SWC_1, SWC_2, . . . ) are generated to connect or block the write driver (1420, see FIG. 1) to the memory cells.

In step S240, the write driver 1420 simultaneously performs programming of the first data D0 and the second data D1 for the selected memory cells. At this time, the program will be executed only in memory cells connected by the write driver 1420 and the switches SW0, SW1, and SW2. The programs of the memory cells blocked by the switches SW0, SW1, and SW2 are skipped.

In the above, the selective write operation of the embodiment in which each write phase of the data D0 and D1 is performed simultaneously is briefly described.

Figure 10:
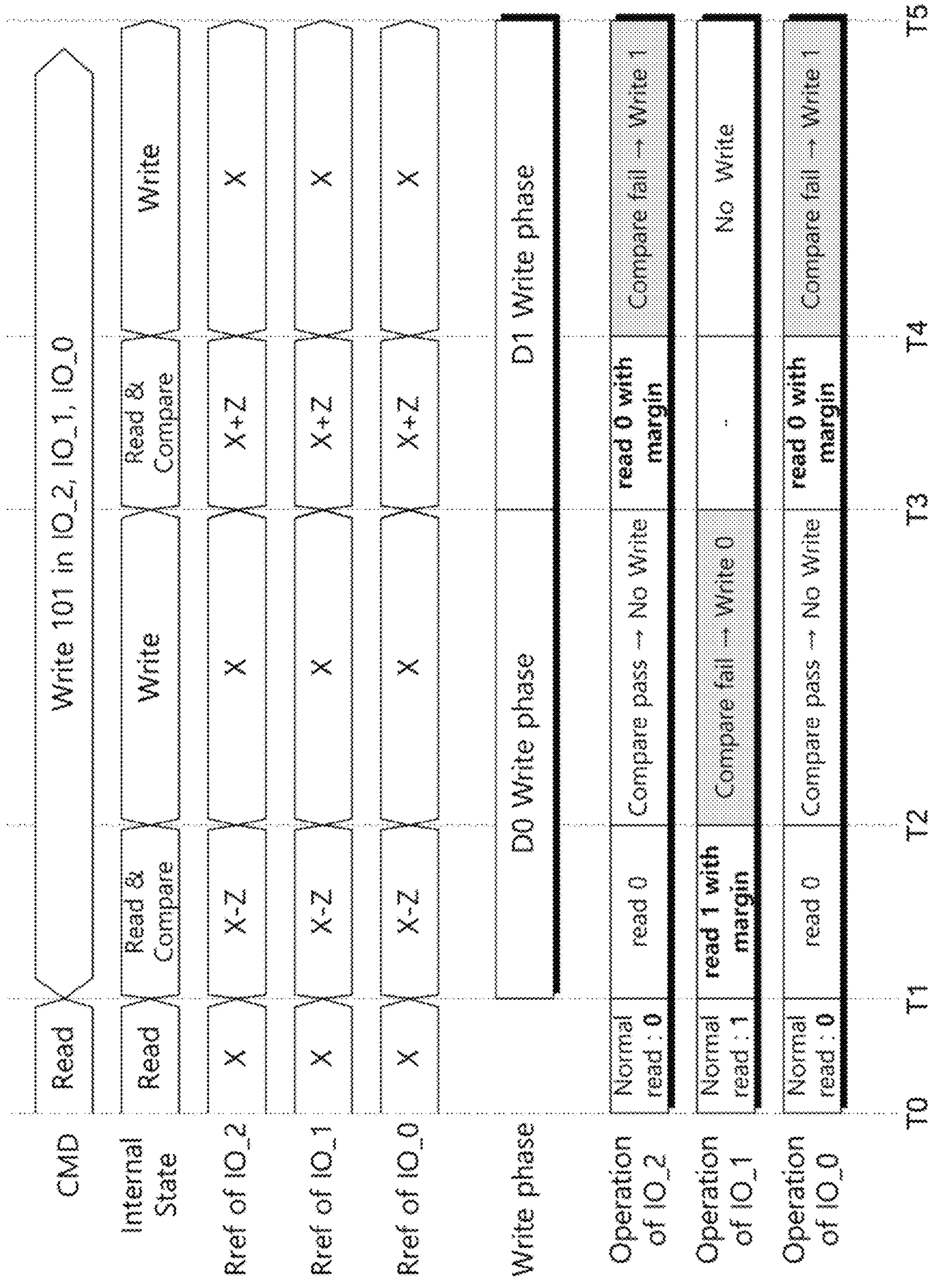
FIG. 10 is a timing diagram showing the internal operation of the resistive memory device during a selective write operation in which data is written according to the separate write phase of FIG. 6.

FIG. 10 is a timing diagram showing the internal operation of the resistive memory device during a selective write operation in which data is written according to the separate write phase of FIG. 6. Referring to FIG. 10, the selective write controller 1620*a* (see FIG. 6) may perform programming for selected memory cells by setting a reference resistor Rref for each write phase. Here, write operations will be described only for three input/output units IO_0, IO_1, and IO_2.

At time T0, a normal read command for selected memory cells is provided. Then, the read/write circuit 1400 sets a reference resistor Rref to read the memory cells selected for each of the input/output units IO_0, IO_1, and IO_2. At this time, the read/write circuit 1400 will set the reference resistor Rref of the input/output units IO_0, IO_1, and IO_2 to the default resistance value (X) with no increase or decrease in margin. Data stored in memory cells selected by a normal read operation will be output as '010' for each input/output units IO_0, IO_1, and IO_2.

At time T1, a write command is provided for the selected memory cells. That is, write data '101' is provided along with the write command to the same memory cells as the memory cells selected at time T0. Then, the writing phase for the first data D0 will start at time T1, and the writing phase for the second data D1 will start at time T3.

At time T1, a read and compare operation is performed on memory cells to write the first data D0. The selective write controller 1620*a* sets the reference resistor Rref for read and compare operations. That is, the selective write controller 1620*a* sets the reference resistor Rref to a resistance value (X−Z) obtained by subtracting a specific margin (Z) from the default resistance value (X) for a selective write operation of the first data D0. Then, the memory cell whose read margin substantially increases corresponds to the memory cell of the input/output unit IO_1 in which the second data D1 is stored. On the other hand, since the first data D0 is stored in the memory cells of the input/output units IO_0 and IO_2, the read margin is substantially reduced. A comparison between write data D0 and read results is performed. At this time, the read result of the memory cells of the input/output units IO_0 and IO_2 is the same as the first data D0. And the read result of the memory cell of the input/output unit IO_1 corresponds to the second data D1 and is therefore different from the first data D0.

At time T2, whether to write the first data D0 is determined according to the results of the read and compare operation. The read results of the memory cells of the input/output units IO_0 and IO_2 are the same as the first data D0, which is write data. Therefore, the comparison result for the memory cells of the input/output units IO_0 and IO_2 will be determined as compare pass. The read result of the memory cell of the input/output unit IO_1 is detected differently from the first data D0, which is write data. Therefore, the comparison result for the memory cell of the input/output unit IO_1 will be determined as a compare fail. For a selective write operation, first data D0, which is write data, is applied only to memory cells corresponding to a compare fail. Accordingly, the first data D0, which is write data, will be programmed only to the memory cells of the input/output unit IO_1. The write operation is skipped for the memory cells of the input/output units IO_0 and IO_2 determined to be compare pass.

At time T3, the writing phase of the second data D1 begins. At time T3, a read and compare operation is performed on memory cells to write the second data D1. The selective write controller 1620*a* sets the reference resistor Rref for read and compare operations. The selective write controller 1620*a* sets the reference resistor Rref to a resistance value (X+Z) obtained by adding a specific margin (Z) to the default resistance value (X) for the selective write operation of the second data D1. Then, memory cells whose read margin substantially increases correspond to memory cells of the input/output units IO_0 and IO_2 in which the first data D0 is stored. On the other hand, in the write operation of the first data D0, the memory cell of the input/output unit IO_1 to which data has already been written may be excluded from the read and compare operation and the write operation.

A comparison is performed between the second data D1, which is write data, and the read result. At this time, the read results of the memory cells of the input/output units IO_0 and IO_2 each correspond to the first data D0. The data stored in the memory cells of the input/output units IO_0 and IO_2 and the second data D1, which is write data, are different.

At time T4, whether to write the second data D1 is determined according to the results of the read and compare operations. The read results of the memory cells of the input/output units IO_0 and IO_2 are different from the second data D1, which is write data. Therefore, the comparison result for the memory cells of the input/output units IO_0 and IO_2 will be determined as a compare fail. For the selective write operation, the second data D1, which is write data, is applied only to the memory cells of the input/output units IO_0 and IO_2 corresponding to the compare fail. Accordingly, the second data D1, which is write data, will be programmed only in the memory cells of the input/output units IO_0 and IO_2.

In the above, the selective write operation of performing programming for memory cells by separating the write phase for each data D0 and D1 was briefly explained. Here, an example in which the first data D0 is written before the second data D1 has been described, but embodiments are not limited to this order.

Figure 11:
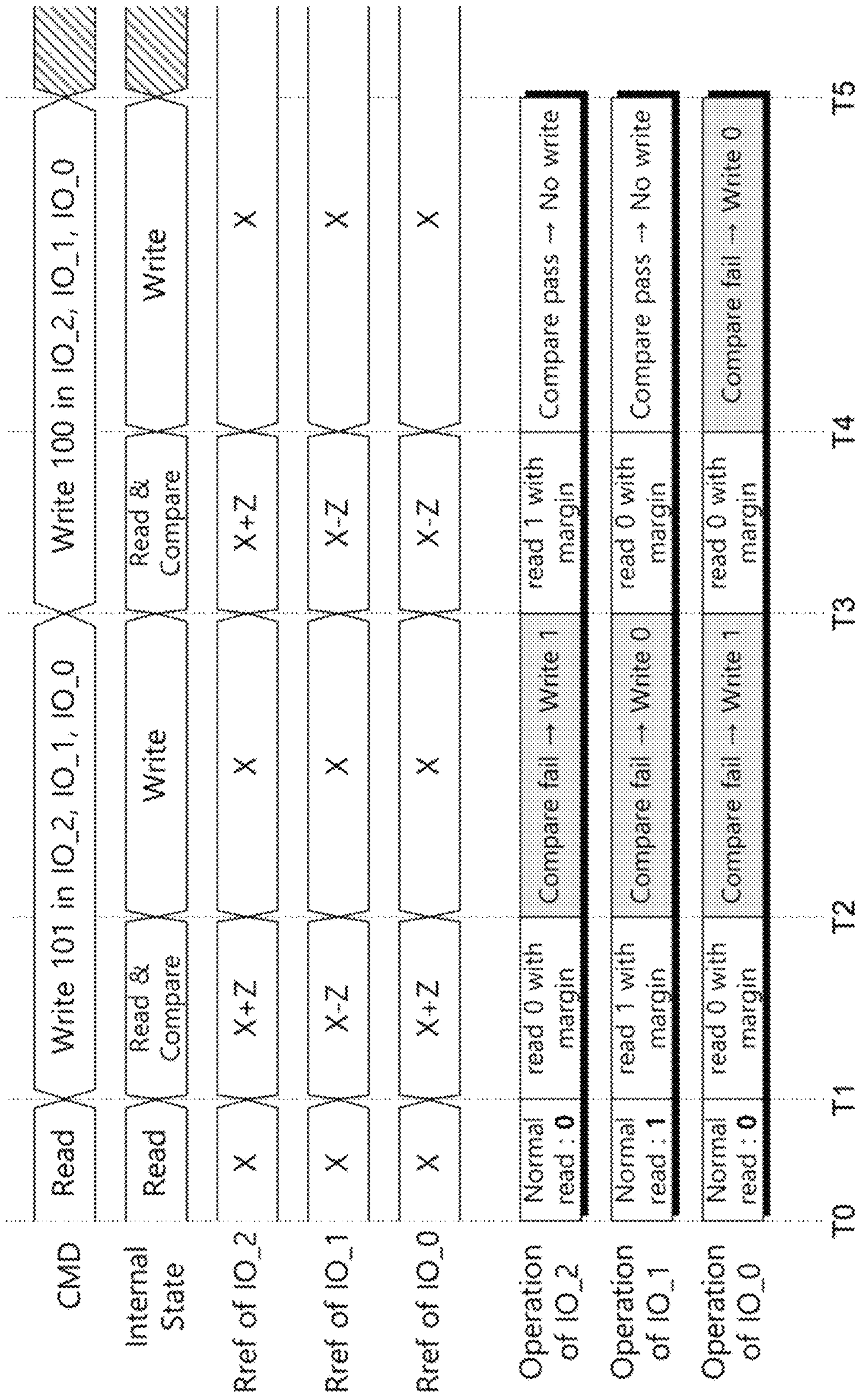
FIG. 11 is a timing diagram showing the internal operation of the resistive memory device during a selective write operation by the selective write controller shown in FIG. 8.

FIG. 11 is a timing diagram showing the internal operation of the resistive memory device during a selective write operation by the selective write controller shown in FIG. 8. Referring to FIG. 11, the selective write controller 1620*b* can simultaneously perform read, compare, and write operations regardless of the bit value of the write data provided in input/output units. Here, for convenience of explanation, write operations for three input/output units IO_2, IO_1, and IO_0 will be described.

At time T0, a normal read command is provided for the selected memory cells. Then, the read/write circuit 1400 sets a reference resistor Rref to read the memory cells selected for each of the input/output units IO_2, IO_1, and IO_0. At this time, the read/write circuit 1400 will set the reference resistor Rref of the input/output units IO_2, IO_1, and IO_0 to the default resistance value (X) with no increase or decrease in margin. Data stored in memory cells selected by a normal read operation will be output as '010' for each input/output units IO_2, IO_1, and IO_0.

At time T1, a write command is provided for the selected memory cells. That is, write data '101' is provided along with a write command to the same memory cells as the memory cells selected at time T0. Then, a read and compare operation is performed on memory cells corresponding to each input/output unit IO_2, IO_1, and IO_0 from time T1. The selective write controller 1620*b* sets the reference resistor Rref for read and compare operations.

To set the reference resistor Rref, the selective write controller 1620*b* applies a margin (Z) to the reference resistor Rref for each input/output unit IO_2, IO_1, and IO_0 according to write data '101'. For example, the reference resistor Rref of the second input/output unit IO_2 in which the second data D1 is written may be set to a resistance value (X+Z) obtained by adding a specific margin (Z) to the default resistance value (X). The reference resistor Rref of the first input/output unit IO_1 in which the first data D0 is written will be set to a resistance value (X−Z) obtained by subtracting a specific margin (Z) from the default resistance value (X). And the reference resistor Rref of the first input/output unit (IO_0) in which the second data D1 is written will be set to the resistance value (X+Z) obtained by adding the margin (Z) to the default resistance value (X). Accordingly, the margin (Z) is added or subtracted from the reference resistance for reading all selected memory cells.

Data stored in each memory cell is output through a read-before-write operation using a margin-applied reference resistor Rref. The stored data '010' is sensed from each memory cell of the input/output unit IO_2, IO_1, and IO_0.

At time T2, a write operation is performed on the memory cells of each of the input/output units IO_2, IO_1, and IO_0 according to the results of the read and compare operations. The read result '010' of each memory cell of the input/output units IO_2, IO_1, and IO_0 corresponds to the inverted data of the write data '101'. Therefore, the comparison result for the memory cells of each of the input/output units IO_2, IO_1, and IO_0 will be judged as a compare fail. Therefore, for the selective write operation, write data '101' is programmed into the memory cells of each of the input/output units IO_2, IO_1, and IO_0.

At time T3, a write command is provided for the selected memory cells. That is, write data '100' is provided along with the write command to the same memory cells as the memory cells selected at time T0. Then, a read and compare operation is performed on memory cells corresponding to each input/output unit IO_2, IO_1, and IO_0 from time T1. The selective write controller 1620*b* sets the reference resistor Rref for read and compare operations.

To set the reference resistor Rref, the selective write controller 1620*b* applies the margin (Z) to the reference resistor Rref for each input/output unit IO_2, IO_1, and IO_0 according to the write data '100'. For example, the reference resistor Rref of the second input/output unit IO_2 in which the second data D1 is written will be set to the resistance value (X+Z) obtained by adding the margin (Z) to the default resistance value (X). The reference resistor Rref of the input/output units IO_1 and IO_0 in which the first data D0 is written will be set to the resistance value (X−Z) obtained by subtracting the margin (Z) from the default resistance value (X). Accordingly, the margin (Z) is added to or subtracted from the reference resistance for reading all selected memory cells. Data stored in each memory cell is output through the read-before-write operation using the margin-applied reference resistor Rref. The stored data '101' is sensed from each memory cell of the input/output units IO_2, IO_1, and IO_0.

At time T4, a write operation is performed on the memory cells of each of the input/output units IO_2, IO_1, and IO_0 according to the results of the read and compare operations. '101', which is the read result of each memory cell of the input/output units IO_2 IO_1, and IO_0, has an inverted relationship only with the LSB compared to the write data '100'. Accordingly, the first data D0 may be programmed only in the memory cell of the input/output unit IO_0, and the programming of the remaining memory cells may be skipped.

In the above, the selective write operation of an embodiment in which the write phase for each data D0 and D1 is not separated but is simultaneously programmed into memory cells has been described. For the selective write operation, the read-before-write operation is performed in which the read margin is applied in a direction unfavorable to the write data. Therefore, the reliability of the read-before-write operation can be improved, and the reliability of the write operation can also be improved.

What is claimed is:

1. A resistive memory device comprising:

at least one memory cell;

a reference resistance circuit;

a sense amplifier configured to read existing data stored in the at least one memory cell by comparing a resistance value of the at least one memory cell with a reference resistance value of the reference resistance circuit;

a write driver configured to program write data into the at least one memory cell; and a controller configured to:

set the reference resistance value to a default resistance value when the sense amplifier performs a read operation; and set the reference resistance value to an adjusted resistance value different from the default resistance value according to the write data when the sense amplifier performs a read-before-write operation during a selective write operation.

2. The resistive memory device of claim 1, wherein a first data corresponding to a first resistance value or a second data corresponding to a second resistance value greater than the first resistance value is stored in the at least one memory cell, and wherein the controller is further configured to set the reference resistance circuit to a first changed reference resistance value subtracted by a specific margin from the default resistance value in response to a first request to write the first data.

3. The resistive memory device of claim 2, wherein the controller is further configured to set the reference resistance circuit to a second changed reference resistance value obtained by adding the specific margin to the default resistance value in response to a second request to write the second data.

4. The resistive memory device of claim 3, wherein the controller comprises:

a multiplexer configured to select one of the specific margin and a zero margin according to an operation mode; and an adder/subtractor configured to set the reference resistance circuit by adding or subtracting an output of the multiplexer and the default resistance value according to the write data.

5. The resistive memory device of claim 4, wherein the controller is further configured to program the write data by distinguishing between a first writing phase of the first data to be written in a first memory cell and a second writing phase of the second data to be written to a second memory cell.

6. The resistive memory device of claim 3, wherein the controller comprises:

a first multiplexer configured to select one of the specific margin and a zero margin according to an operation mode;

an adder configured to add an output of the first multiplexer and the default resistance value;

a subtractor configured to subtract the output of the first multiplexer from the default resistance value; and a second multiplexer configured to set the reference resistance circuit by selecting either an output of the adder or an output of the subtractor according to the write data.

7. The resistive memory device of claim 6, wherein the controller is further configured to simultaneously write the first data to a first memory cell and the second data to a second memory cell.

8. The resistive memory device of claim 1, further comprising:

a switch configured to connect the write driver to the at least one memory cell; and a comparator configured to compare the existing data with the write data to generate a switch control signal that connects or disconnects the write driver and the at least one memory cell, wherein the existing data is output from the sense amplifier.

9. The resistive memory device of claim 1, wherein the at least one memory cell comprises a magnetic tunnel junction element and an access transistor.

10. A method of operating a resistive memory device, the method comprising:

setting a reference resistance to a default resistance value for performing a read operation in a selected memory cell;

performing the read operation on the selected memory cell using the default resistance value;

receiving write data to be written into the selected memory cell;

increasing or decreasing the reference resistance to a changed reference resistance value according to a value of the write data for a read-before-write operation to the selected memory cell;

performing the read-before-write operation on the selected memory cell according to the changed reference resistance value; and selectively writing the write data to the selected memory cell according to a result of the read-before-write operation.

11. The method of claim 10, wherein the reference resistance is set to the default resistance value during the read operation and is either decreased to a first resistance value with a specific margin subtracted from the default resistance value or increased to a second resistance value with the specific margin increased from the default resistance value during the read-before-write operation.

12. The method of claim 11, wherein if the write data is first data corresponding to a first resistance state lower than the default resistance value, the reference resistance is set to the first resistance value, and if the write data is second data corresponding to a second resistance state higher than or equal to the default resistance value, the reference resistance is set to the second resistance value.

13. The method of claim 12, further comprising comparing the write data with existing data stored in the selected memory cell detected through the read-before-write operation.

14. The method of claim 13, wherein based on the existing data and the write data being the same, programming operation of the write data to the selected memory cell is skipped.

15. The method of claim 14, wherein based on the existing data and the write data being different, the write data is programmed into the selected memory cell.

16. A resistive memory device, comprising:

a cell array comprising a plurality of magnetoresistive random-access memory (MRAM) cells;

a row decoder configured to drive word lines of the plurality of MRAM cells in response to a row address;

a read/write circuit connected to bit lines or source lines of the cell array and configured to perform a read-before-write operation on a selected memory cell based on a reference resistance value of a reference resistance circuit; and a control circuit configured to:

set the reference resistance value of the reference resistance circuit to a default resistance value during a read operation; and set the reference resistance value of the reference resistance circuit to an adjusted resistance value different from the default resistance value according to write data during a read-before-write operation that is part of a selective write operation.

17. The resistive memory device of claim 16, wherein the read/write circuit comprises:

a sense amplifier configured to detect existing data stored in the selected memory cell by comparing the reference resistance value of the reference resistance circuit with a resistance value of the selected memory cell; and a write driver configured to selectively program the write data into the selected memory cell according to a result of the read-before-write operation.

18. The resistive memory device of claim 16, wherein the reference resistance value of the reference resistance circuit is set to the default resistance value during the read operation, and is either decreased to a first resistance value with a specific margin subtracted from the default resistance value or increased to a second resistance value with the specific margin increased from the default resistance value during the read-before-write operation.

19. The resistive memory device of claim 16, wherein the control circuit comprises:

a multiplexer configured to select either a specific margin or a zero margin according to an operation mode; and an adder/subtractor configured to set the reference resistance circuit by adding or subtracting an output of the multiplexer and the default resistance value according to the write data.

20. The resistive memory device of claim 16, wherein the control circuit comprises:

a first multiplexer configured to select either a specific margin or a zero margin according to an operation mode;

an adder configured to add an output of the first multiplexer and the default resistance value;

a subtractor configured to subtract an output of the first multiplexer from the default resistance value; and a second multiplexer configured to set the reference resistance circuit according to either an output of the adder or an output of the subtractor according to the write data.

* * * * *